(12) United States Patent
Singh et al.

(10) Patent No.: US 10,749,552 B2
(45) Date of Patent: Aug. 18, 2020

(54) PSEUDO DIFFERENTIAL RECEIVING MECHANISM FOR SINGLE-ENDED SIGNALING

(71) Applicant: Advanced Micro Devices, Inc., Santa Clara, CA (US)

(72) Inventors: Balwinder Singh, Union City, CA (US); Milam Paraschou, Dellwood, MN (US); Chad S. Gallun, Austin, TX (US); Jeffrey Cooper, Fort Collins, CO (US); Dean E. Gonzales, Fort Collins, CO (US); Alushulla Jack Ambundo, Austin, TX (US); Thomas H. Likens, III, Austin, TX (US); Gerald R. Talbot, Concord, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/140,364

(22) Filed: Sep. 24, 2018

(65) Prior Publication Data

US 2020/0099406 A1 Mar. 26, 2020

(51) Int. Cl.
*H04B 1/04* (2006.01)
*H03M 1/80* (2006.01)
*H01L 27/02* (2006.01)
*H04B 1/16* (2006.01)

(52) U.S. Cl.
CPC ........... *H04B 1/04* (2013.01); *H01L 27/0248* (2013.01); *H03M 1/808* (2013.01); *H04B 1/16* (2013.01); *H03F 2200/129* (2013.01)

(58) Field of Classification Search
USPC ......................................... 375/257; 330/253
See application file for complete search history.

(56) References Cited

U.S. PATENT DOCUMENTS

| | | | |
|---|---|---|---|
| 3,795,901 | A | 3/1974 | Boehm et al. |
| 4,689,620 | A | 8/1987 | Wondrak |
| 5,610,414 | A | 3/1997 | Yoneda et al. |
| 5,694,427 | A | 12/1997 | Wincn |
| 5,963,484 | A | 10/1999 | Jung |

(Continued)

OTHER PUBLICATIONS

Paraschou et al., U.S. Appl. No. 16/140,356, entitled "Low Power Mechanism for VTT Generation for Receiver Termination", filed Sep. 24, 2018, 38 pages.

(Continued)

*Primary Examiner* — Eva Y Puente
(74) *Attorney, Agent, or Firm* — Kowert Hood Munyon Rankin and Goetzel PC; Rory D. Rankin

(57) ABSTRACT

Systems, apparatuses, and methods for performing efficient data transfer in a computing system are disclosed. A computing system includes multiple transmitters sending singled-ended data signals to multiple receivers. A termination voltage is generated and sent to the multiple receivers. The termination voltage is coupled to each of signal termination circuitry and signal sampling circuitry within each of the multiple receivers. Any change in the termination voltage affects the termination circuitry and affects comparisons performed by the sampling circuitry. Received signals are reconstructed at the receivers using the received signals, the signal termination circuitry and the signal sampling circuitry.

20 Claims, 4 Drawing Sheets

(56) References Cited

U.S. PATENT DOCUMENTS

| | | |
|---|---|---|
| 6,504,420 B1 | 1/2003 | Vorenkamp et al. |
| 6,720,804 B2 | 4/2004 | Taguchi et al. |
| 6,937,111 B2 | 8/2005 | Kwon |
| 6,944,071 B2 | 9/2005 | Martin |
| 6,972,607 B1 | 12/2005 | Chen et al. |
| 6,992,501 B2 | 1/2006 | Rapport |
| 7,034,565 B2 | 4/2006 | Lee |
| 7,095,217 B1 * | 8/2006 | Niculae ............ G05F 1/56 323/274 |
| 7,099,395 B1 * | 8/2006 | Sidiropoulos ....... H04L 25/0292 326/27 |
| 8,164,362 B2 | 4/2012 | Afghahi et al. |
| 8,344,808 B2 | 1/2013 | Samavedam et al. |
| 8,710,810 B1 | 4/2014 | McJimsey et al. |
| 2003/0234674 A1 | 12/2003 | Morgan |
| 2004/0264230 A1 | 12/2004 | Brand et al. |
| 2006/0117155 A1 | 6/2006 | Ware et al. |
| 2008/0029824 A1 | 2/2008 | Baizley et al. |
| 2009/0256587 A1 | 10/2009 | Kuboyama et al. |
| 2010/0164622 A1 * | 7/2010 | Ge ..................... H03F 3/005 330/253 |
| 2012/0197568 A1 | 8/2012 | Souma |
| 2014/0140419 A1 | 5/2014 | Poulton et al. |
| 2015/0002189 A1 | 1/2015 | Dietl et al. |
| 2017/0169868 A1 | 6/2017 | Huang et al. |
| 2017/0288434 A1 * | 10/2017 | Narita ................ H02J 7/0052 |

OTHER PUBLICATIONS

Gonzales et al., U.S. Appl. No. 16/118,054, entitled "Low Loss T-Coil Configuration With Frequency Boost for an Analog Receiver Front End", filed Aug. 30, 2018, 29 pages.

Non-Final Office Action in U.S. Appl. No. 16/140,356, dated Jul. 12, 2019, 9 pages.

Non-Final Office Action in U.S. Appl. No. 16/118,054, dated Apr. 30, 2019, 12 pages.

Tyan, Eer-Wen, U.S. Appl. No. 11/147,002, entitled "Low power termination circuit", filed Jun. 7, 2005, 15 pages.

International Search Report and Written Opinion in International Application No. PCT/US2019/039395, dated Sep. 30, 2019, 13 pages.

Notice of Allowance in in U.S. Appl. No. 16/118,054, dated Aug. 21, 2019, 10 pages.

Final Office Action in U.S. Appl. No. 16/140,356, dated Oct. 24, 2019, 9 pages.

* cited by examiner

PSEUDO DIFFERENTIAL RECEIVING MECHANISM FOR SINGLE-ENDED SIGNALING

BACKGROUND

Description of the Related Art

When transferring information between functional blocks in a semiconductor chip, electrical signals are sent on multiple, parallel metal traces. Transmitters in a first functional block send the electrical signals across the parallel metal traces. Receivers in a second functional block receive the electrical signals. In some cases, the two functional blocks are within a same die. In other cases, the two functional blocks are on separate dies. In either case, the metal traces have transmission line effects such as distributed inductance, capacitance and resistance throughout its length. For modern integrated circuits, the interconnect capacitance reduces signal integrity and signal transfer rate more so than gate capacitance of semiconductor devices.

The interconnect capacitance per unit length includes both sidewall fringing capacitance and cross-coupling capacitance. For example, the electromagnetic fields for the metal traces conducting signals and the return current on the ground plane create electrical interference on neighboring metal traces and on adjacent devices. As the operating voltage continues to decrease to reduce power consumption, the signal swing used for Boolean logic decreases as well as the noise margin.

In view of the above, efficient methods for receiving information as signals in a computing system are desired.

BRIEF DESCRIPTION OF THE DRAWINGS

The advantages of the methods and mechanisms described herein may be better understood by referring to the following description in conjunction with the accompanying drawings, in which.

Figure 1:
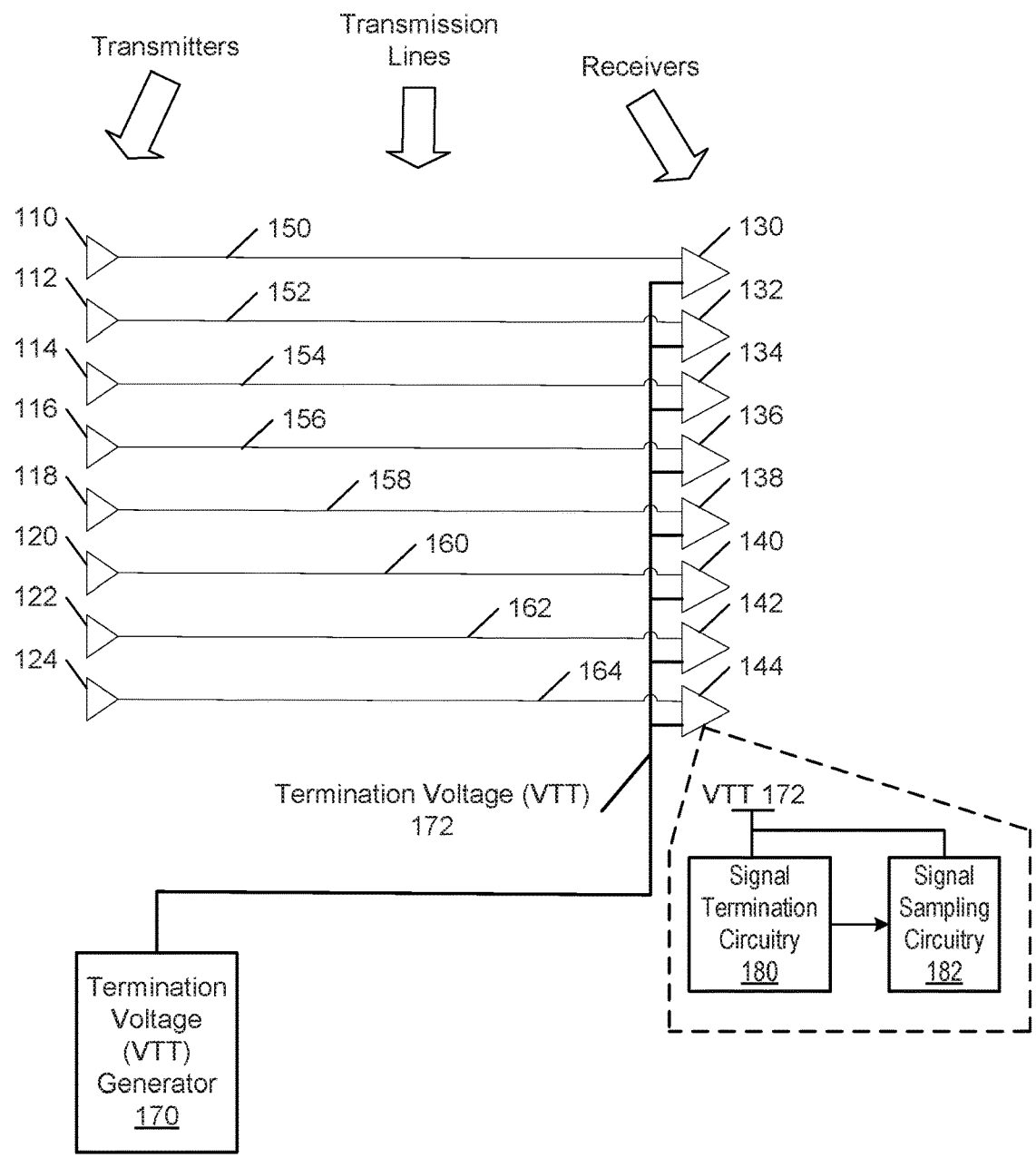
FIG. 1 is a block diagram of one embodiment of a communication bus.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for receiving information as signals in a computing system are disclosed. In various embodiments, a computing system includes one or more functional blocks for processing applications. Examples of the functional blocks include a general-purpose central processing unit (CPU), a graphics processing unit (GPU), an accelerated processing unit (APU), an input/output (I/O) device, a memory controller for system memory, and so forth. The computing system also includes multiple interfaces for transferring data between the functional blocks. In some cases, two functional blocks transferring data between one another are within a same die. In other cases, the two functional blocks are on separate dies.

When transferring information between functional blocks, electrical signals are sent on multiple, parallel metal traces. Transmitters in a first functional block send the electrical signals across the parallel metal traces. Receivers in a second functional block receive the electrical signals. In either case, the metal traces have transmission line effects, such as distributed inductance, capacitance and resistance throughout the line length. To reduce signal reflection, the far end (receiving end) of the metal traces are terminated using the characteristic impedances of the metal traces. In some embodiments, on-die termination (ODT) is used where a termination resistor for impedance matching is located inside the receiver instead of externally from the receiver such as on a printed circuit board (PCB) or off-die on a system on a chip (SOC) or multichip module (MCM).

In addition to terminating the metal trace at the receiver, each receiver includes circuitry for electrostatic discharge protection and sampling circuitry for reconstructing the received input signal. The sampling circuitry receives the input signal after the termination circuitry and the protection circuitry. The sampling circuitry reconstructs the input signal by comparing the received input signal to a reference voltage. In various embodiments, a termination voltage generator sends a termination voltage to multiple receivers. In some embodiments, one or more of the multiple receivers use the received termination voltage in both the termination circuitry and the sampling circuitry. Therefore, each of the termination circuitry and the sampling circuitry are able to track the common mode noise on the received input signal.

In an embodiment, within a receiver, an on-die termination (ODT) resistor receives the input signal on a first end and receives the termination voltage (VTT) on a second end. Therefore, the common mode current-resistance (IR) drop across the ODT resistor (from the input signal to the termination voltage) sends the common mode characteristics on the input signal path, such as to the protection circuitry and the sampling circuitry. Additionally, any noise on the received input signal and any noise on the termination voltage are tracked.

In various embodiments, one or more sense amplifiers within the sampling circuitry receive the termination voltage on an input terminal used to receive a reference voltage. Therefore, the same termination voltage used by the termination circuitry is also used as the reference voltage in the sampling circuitry. Any change of the termination voltage due to noise causes a same change within each of the termination circuitry and the sampling circuitry. Further, it is unnecessary for the receiver to include filtering circuitry to extract the common mode portion of the input signal for sending to the sampling circuitry.

Referring to FIG. 1, a generalized block diagram of one embodiment of a communication bus 100 is shown. As shown, communication bus 100 includes transmitters 110-124 for sending information as electrical signals, transmission lines 150-164 for transferring the electrical signals, and receivers 130-144 for receiving the signals. Additionally, communication bus 100 includes a termination voltage (VTT) generator 170 for generating termination voltage (VTT) 172. As shown, VTT 172 is sent to each of the receivers 130-144. In various embodiments, one or more of the receivers 130-144 uses VTT 172 in both termination circuitry and sampling circuitry. In the illustrated embodiment, receiver 144 couples VTT 172 to each of termination circuitry 180 and sampling circuitry 182.

It is noted that the term "bus" may also be referred to as a "channel," and each "transmission line" is a "lane" or a "trace" or a "wire." In various embodiments, transmission lines 150-164 are constructed from a variety of suitable metal sources during semiconductor fabrication and surrounded by a variety of any suitable insulating material. It is also noted that the terms "pin," "port," "terminal," and "node" are used interchangeably herein. Although eight transmitters 110-124, eight transmission lines 150-164 and eight receivers 130-144 are shown, in other embodiments, any number of these components is used.

In some embodiments, a bus with 40 transmission lines uses communication bus 100 instantiated five times. Accordingly, an average value of VTT 172 is at least partially derived from average transmitter currents being pushed and pulled (sourced and sunk) on transmission lines 150-164 by circuitry in transmitters 110-124. The directions of the transmitter currents on transmission lines 150-164 are based on whether the transmission lines 150-164 are being charged to logic high values or discharged to logic low values. In other words, the direct current (DC) patterns on the transmission lines 150-164 over time partially derive the average value of VTT 172.

In some embodiments, when the bus with 40 transmission lines uses communication bus 100 instantiated five times, each instantiation of communication bus 100 uses a respective VTT generator. The value of VTT 172 in each instantiation is set by the VTT generator in each instantiation. The average value of VTT 172 is partially set by the average transmitter currents being pushed and pulled by the eight transmitters 110-124 charging and discharging the eight transmission lines 150-164. In other embodiments, a single VTT generator, such as VTT generator 170, sends VTT 172 to each of the 40 receivers. In such embodiments, the value of VTT 172 is set by the VTT generator 170. The average value of VTT 172 is partially set by the average transmitter currents being pushed and pulled by the 40 transmitters charging and discharging the 40 transmission lines.

In some embodiments, the signals sent from transmitters 110-124 to receivers 130-144 are single-ended data signals. The term "single-ended signal" is defined as an electric signal which is transmitted using a single signal conductor. For example, in an embodiment, receiver 130 receives a single-ended signal from transmitter 110 via transmission line 150, which is a single signal conductor. In contrast to using single-ended data signals, sending information with differential data signals uses more lines and more pins. A reference signal is not generated and sent to multiple pins (or multiple receivers) when differential data signals are used. As is known in the art, differential signaling generally provides better noise immunity than single-ended signaling. However, the use of differential signaling comes at the added cost of extra pins and extra traces.

In order to better handle noise issues when using single-ended signaling, communication bus 100 uses VTT 172 in each of the signal termination circuitry 180 and the signal sampling circuitry 182. Any noise on one of the received input signals on transmission lines 150-164 and any noise on VTT 172 are tracked by each of the signal termination circuitry 180 and the signal sampling circuitry 182. In various embodiments, a capacitance is used within VTT generator 170 to reduce noise on VTT 172 and keep VTT 172 as stable as possible. In some embodiments, the capacitance used within VTT generator 170 is a lumped capacitance, whereas, in other embodiments, this capacitance is a distributed capacitance. By limiting the noise on VTT 172 with this capacitance within VTT generator 170, the common mode noise received by samplers within the receivers 130-144 is also reduced.

As shown in FIG. 1, when cross coupling capacitance on transmission lines 150-164 (and additional external transmission lines, in some embodiments) causes VTT 172 to change its value from its generated value, the change is received by each of the signal termination circuitry 180 and the signal sampling circuitry 182. For example, the signal sampling circuitry 182 receives a value generated by the signal termination circuitry 180 and compares it to a reference voltage, which is VTT 172. The value generated by the signal termination circuitry 180 is based on a current-resistance (IR) voltage drop across a termination resistor. This IR drop is from the received input signal to the termination voltage VTT 172. Any change in VTT 172 affects the IR drop in the signal termination circuitry 180 and affects the comparison by the signal sampling circuitry 182.

Figure 2:
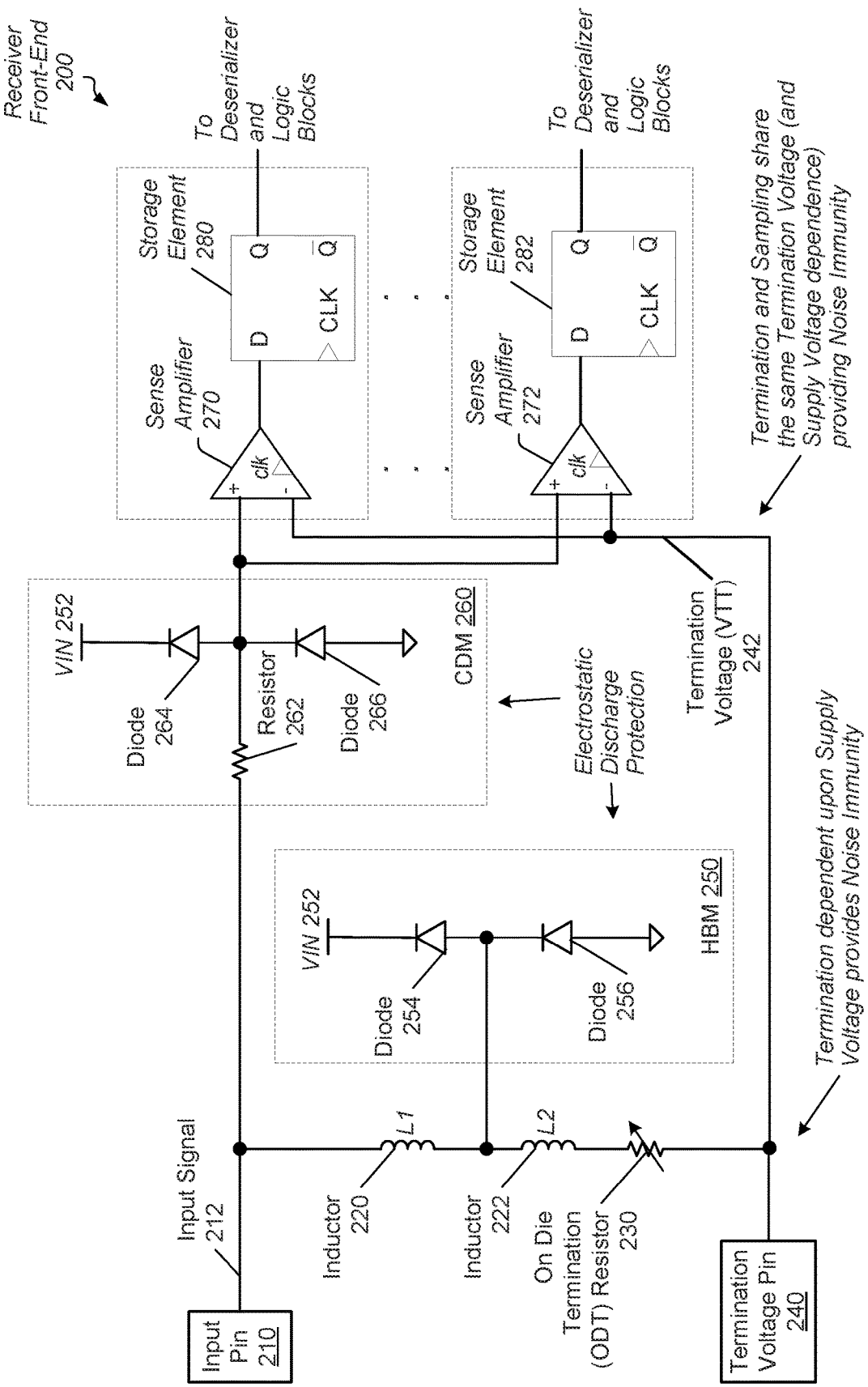
FIG. 2 is a block diagram of one embodiment of a receiver front-end.

Turning now to FIG. 2, a generalized block diagram of one embodiment of a receiver front-end 200 is shown. In the illustrated embodiment, receiver front-end 200 includes an input pin 210 for receiving an input signal 212, a termination voltage pin 240 for receiving the termination voltage VTT 242, an on die termination (ODT) resistor 230, electrostatic discharge (ESD) protection circuitry such as human body model (HBM) block 250 and charged device model (CDM) block 260, and sampling circuitry such as sense amplifiers 270-272. Receiver front-end 200 also includes storage elements 280-282 for storing the outputs of the sense amplifiers 270-272 before sending the outputs to other circuitry within the receiver. In the illustrated embodiment, each of the termination circuitry, such as ODT resistor 230, and the sampling circuitry, such as sense amplifiers 270-272, receive the termination voltage VTT 242. Therefore, any change in VTT 242 from its expected value affects the IR drop across ODT resistor 230 and affects the comparison performed by the sense amplifiers 270-272. As shown, a fixed reference voltage is not received by sense amplifiers 270-272. A fixed reference voltage does not track the common mode noise on the input signal 212.

In some embodiments, inductor L1 220 and inductor L2 222 are used for impedance matching such as terminating an external transmission line, which sends input signal 212 on input pin 210. Additionally, inductor L1 220 and inductor L2 222 are used to reduce the net effective capacitance at signal 212 by reducing the additional capacitance provided by diodes 254 and 256 within HBM 250. The reduction of the capacitance on input signal 212 aids the functionality of sense amplifiers 270-272. Further, the termination uses ODT resistor 230. Termination circuitry is used to prevent reflection on the external transmission line ending at input pin 210. Reflection at any impedance change point on the external transmission line including the end of the transmission line at receiver front-end 200 results in signal distortion, signal ringing and so forth. In some embodiments, ODT resistor 230 is a variable resistance capable of being set at two or more predetermined values. For example, in an embodiment, ODT resistor 230 is capable of being set from 50 ohms to 200 ohms with a 50 ohm step. As shown, ODT resistor 230 receives input signal 212 via inductors 220 and 222.

In the illustrated embodiment, ODT resistor 230 is not connected to a ground reference voltage. Rather, the other end of ODT resistor 230 receives VTT 242 received from termination voltage pin 240. Accordingly, the IR drop across ODT resistor 230 is dependent on VTT 242. In various embodiments, VTT 242 is generated by an external VTT generator and VTT 242 is sent to multiple receivers. In an embodiment, VTT 242 is generated by an external termination regulator integrated circuit. In some embodiments, VTT 242 is generated to be one half of the supply voltage used by receiver front-end 200. For example, in an embodiment, VTT 242 is generated to be one half of VIN 252. As shown, VTT 242 is also sent to sampling circuitry such as sense amplifiers 270-272. A further description of the sampling circuitry is provided shortly.

As shown, the ESD protection circuitry, such as HBM block 250 and CDM block 260, use diode clamping circuits. For example, the HBM block 250 uses diodes 254 and 256 in a series configuration, and similarly, CDM block 260 uses diodes 264 and 266 in a series configuration. When an input voltage received by either HBM block 250 or CDM block 260 exceeds the supply voltage VIN 252 by a diode drop or the input voltage falls below the ground reference voltage by a diode drop, then one of the diodes in the series configuration is turned on and conducts. Therefore, the output voltage, such as the voltage at a node between the serially connected diodes, from either HBM block 250 or CDM block 260 is clamped. The clamped output voltage does not exceed the supply voltage VIN 252 by a threshold and does not fall below the ground reference voltage by more than a threshold. Here, the threshold is the diode drop of diodes 254, 256, 264 and 266. The series resistor 262 provides an IR drop before the input signal 212 reaches the node between diodes 264 and 266. In other embodiments, other diode networks, such as diode bridges, or a quick-switch (Q-Switch), such as a transistor controlled by an overvoltage detector, or other examples of protection circuitry are used.

In the illustrated embodiment, the output voltage of CDM block 260 is received by sampling circuitry such as sense amplifiers 270-272. Although two sense amplifiers are shown, in other embodiments, any suitable number of sense amplifiers is used. In an embodiment, sense amplifiers 270-272 receive the output voltage of CDM block 260 on a positive terminal and receive the termination voltage VTT 242 on a negative terminal. In various embodiments, sense amplifiers 270-272 are clocked sense amplifiers although a clock input signal is not shown. A dashed box is shown around sense amplifier 270 and sequential element 280 to indicate in various embodiments that one or more clock input signals are received and the circuitry for sense amplifier 270 and sequential element 280 is combined, rather than the circuitry is in in separate elements. Similarly, a dashed box is shown around sense amplifier 272 and sequential element 282 to indicate in various embodiments that one or more clock input signals are received and the circuitry for sense amplifier 272 and sequential element 282 is combined, rather than the circuitry is in separate elements.

In some embodiments, the combination of sense amplifiers 270-272 and storage elements 280-282 sample and store the signal output from CDM 260. Again, in some embodiments, sense amplifiers 270-272 are clocked comparators where the input clock signal is not shown for ease of illustration. In an embodiment, storage elements 280-282 are flip-flop circuits, latches, registers or any other suitable sequential storage element. In an embodiment, one or more of sense amplifiers 270-272 and storage elements 280-282 sample on active edges of a received clock signal, which is not shown for ease of illustration. In some embodiments, the rising edge of a clock signal is used as the active edge, whereas, in other embodiments, the falling edge of the clock signal is used as the active edge. In some embodiments, one or more of sense amplifiers 270-272 and storage elements 280-282 sample on opposite edges of the clock signal than other ones of sense amplifiers 270-272 and storage elements 280-282.

In an embodiment, a period of time between a rising edge and a falling edge on the output of CDM 260 is used to determine a number of logic high values (binary '1') in an input bit stream. A period of time between a falling edge and a rising edge on the output of CDM 260 is used to determine a number of logic low values (binary '0') in an input bit stream. In an embodiment, one or more of sense amplifiers 270-272 and storage elements 280-282 send a stream of binary values to a deserializer (not shown), which is included in the receiver outside of the front-end 200. In an embodiment, the deserializer generates a sequence of parallel data words from the received stream of binary values and sends the data words to other logic blocks and/or arithmetic logic units. In some embodiments, the deserializer decreases the data transfer rate, which allows the other logic blocks to operate at a lower clock frequency than the combination of sense amplifiers 270-272 and storage elements 280-282.

As shown, when sampling the output of CDM 260, sense amplifiers 270-272 use VTT 242 as the reference voltage. Therefore, each of the signal termination circuitry, such as ODT resistor 230, and the sampling circuitry, such as sense amplifiers 270-272, receive VTT 242. Therefore, the common mode current-resistance (IR) drop across ODT resistor 230 (i.e., the voltage difference between input signal 212 and termination voltage VTT 242) sends the common mode voltage of input signal 212 to CDM 260 and sense amplifiers 270-272. Therefore, it is unnecessary for receiver front-end 200 to include filtering circuitry to extract the common mode portion of the input signal 212 for sending to sense amplifiers 270-272.

Additionally, any change of VTT 242 due to noise causes a same change within each of the termination circuitry, such as ODT resistor 230, and the sampling circuitry such as sense amplifiers 270-272. As described earlier, in some embodiments, VTT 242 is generated by an external VTT generator and VTT 242 is sent to multiple receivers. When multiple external transmission lines send a same value, such as a logic high value or a logic low value, for an appreciable amount of time, cross coupling capacitance causes VTT 242 to deviate from its expected value. In addition, during the amount of time the multiple external transmission lines remain at the same value, the transmitters are either pushing current (charging transmission lines to send a logic high value) to the ODT resistor 230 or pulling current (discharging transmission lines to send a logic low value) from the ODT resistor 230. The external VTT generator has a finite current delivery capability to charge or discharge the VTT node (VTT 242) during this amount of time. The average transmitter current is appreciably larger than the current provided by the VTT generator. Accordingly, the value of VTT 242 deviates from its expected value. Despite these sources and other sources of noise on VTT 242, receiver front-end 200 improves noise immunity by having any change in VTT 242 affects the IR drop across ODT resistor 230 and affects in a same manner the comparison performed by sense amplifiers 270-272.

Figure 3:
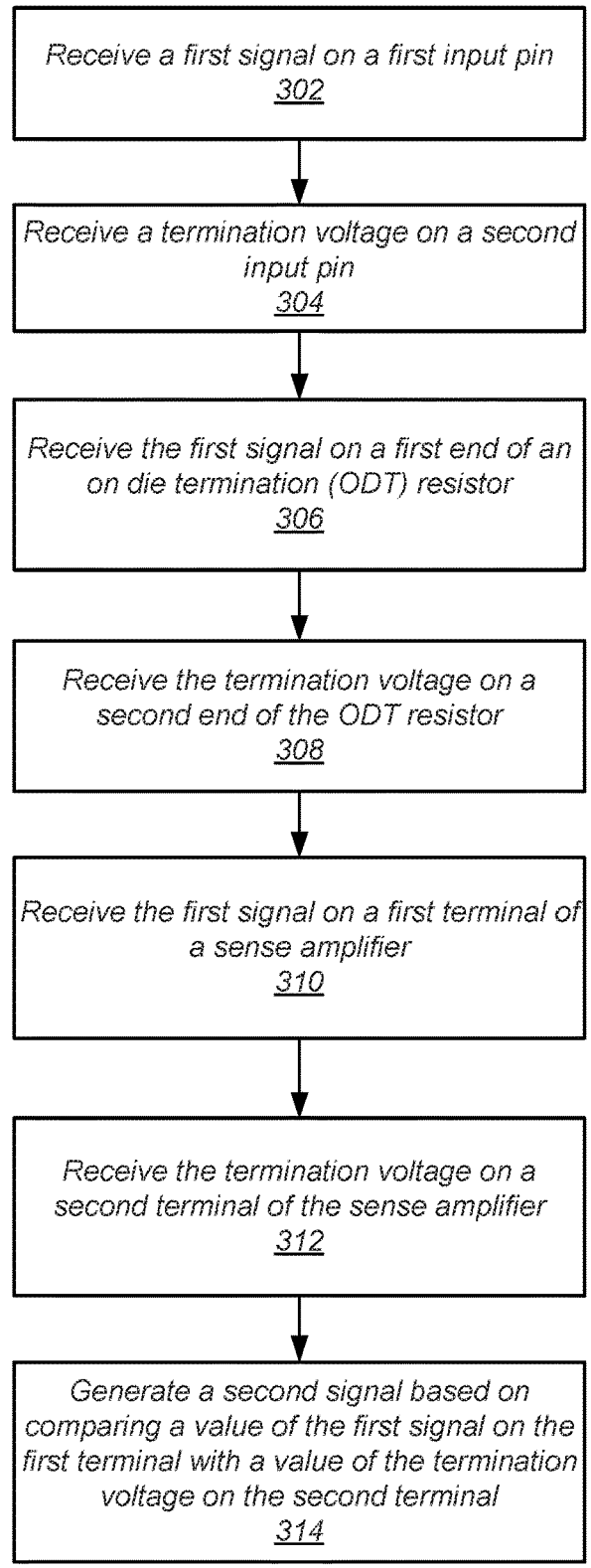
FIG. 3 is a flow diagram of one embodiment of a method for receiving information as signals in a computing system.

Referring now to FIG. 3, one embodiment of a method 300 for receiving information as signals in a computing system is shown. For purposes of discussion, the steps in this embodiment (as well as in FIG. 4) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 300.

A first signal is received on a first input pin (block 302). In some embodiments, the first signal is a single-ended data signal. In an embodiment, the first signal is sent by a transmitter across a transmission line to a receiver. A termination voltage is received on a second input pin (block 304). In various embodiments, the termination voltage is generated by an external termination voltage generator and it is sent to multiple receivers. In some embodiments, the termination voltage is generated to be one half of the supply voltage used by the receivers.

The first signal is received on a first end of an on die termination (ODT) resistor (block 306). In some embodiments, the first signal is received by the first end of the ODT resistor via one or more of a series inductor used for impedance matching and ESD protection circuitry. The termination voltage is received on a second end of the ODT resistor (block 308). No ground connection is used on the second end of the ODT resistor. Therefore, common mode of the input signal is now supply voltage dependent, rather than supply independent as in when a ground reference voltage was used on the second end of the ODT resistor. Now, no filter circuitry is used for extracting the common mode from the received input signal. Additionally, each of the termination circuitry and the sampling circuitry are dependent on the supply voltage of the receiver, rather than the sampling circuitry is only dependent on the supply voltage. When both the termination circuitry and the sampling circuitry are dependent on the supply voltage of the receiver, noise immunity improves.

The first signal is received on a first terminal of a sense amplifier (block 310). In an embodiment, the first signal is received by the first terminal via ESD protection circuitry. The termination voltage is received on a second terminal of the sense amplifier (block 312). Therefore, noise immunity is improved by having any change in the termination voltage affect the IR drop across ODT resistor and affect in a same manner the comparison performed by the sense amplifier. Since the termination voltage is a fraction of the supply voltage used by the receiver, such as one half of the supply voltage, each of the ODT resistor and the sense amplifier has an input dependent on a same power supply, which improves noise immunity. A second signal is generated based on comparing a value of the first signal on the first terminal with a value of the termination voltage on the second terminal (block 314). In some embodiments, the second signal is stored and later sent to a deserializer and other logic blocks such as arithmetic logic.

Figure 4:
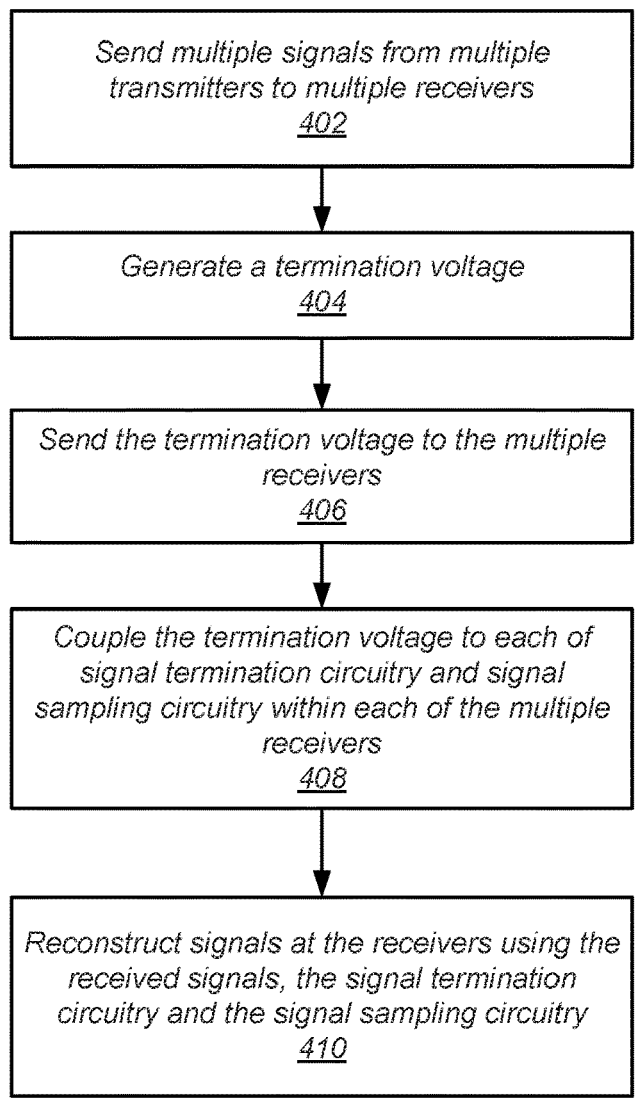
FIG. 4 is a flow diagram of another embodiment of a method for receiving information as signals in a computing system.

Turning now to FIG. 4, one embodiment of a method 400 for receiving information as signals in a computing system is shown. Multiple signals are sent from multiple transmitters to multiple receivers (block 402). A termination voltage is generated (block 404). For example, a termination regulator integrated circuit is used to generate the termination voltage. In an embodiment, the termination voltage is one half of a supply voltage used by the receivers. The termination voltage is sent to the multiple receivers (block 406).

The termination voltage is coupled to each of signal termination circuitry and signal sampling circuitry within each of the multiple receivers (block 408). Accordingly, any change in the termination voltage affects the termination circuitry and affects comparisons performed by the sampling circuitry. Received signals are reconstructed at the receivers using the received signals, the signal termination circuitry and the signal sampling circuitry (block 410). During the reconstruction, any noise on the termination voltage minimally affects the reconstruction due to the improved noise immunity provided by the coupling of the termination voltage to each of the termination circuitry and the sampling circuitry.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors that execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
 a first input configured to receive a first signal;
 a second input configured to receive a termination voltage;
 a resistor coupled to:
  receive the first signal on a first end; and
  receive the termination voltage on a second end; and
 a sense amplifier configured to:
  receive the first signal on a first terminal;
  receive the termination voltage on a second terminal; and
  generate a second signal based on a comparison of a voltage of the first signal to the termination voltage.

2. The circuit as recited in claim 1, wherein each of the resistor and the sense amplifier has an input dependent on a same power supply.

3. The circuit as recited in claim 1, wherein the circuit is further configured to track common mode on the first signal.

4. The circuit as recited in claim 1, wherein the first signal is a single-ended data signal.

5. The circuit as recited in claim 1, wherein the termination voltage is one half of a supply voltage used within the circuit.

6. The circuit as recited in claim 1, wherein the termination voltage is routed to inputs of a plurality of external circuits.

7. The circuit as recited in claim 1, wherein the circuit further comprises electrostatic discharge protection circuitry configured to:
receive the first signal from the first input; and
send the first signal to the first terminal of the sense amplifier.

8. The circuit as recited in claim 1, wherein the circuit further comprises a digital to analog converter configured to:
receive the termination voltage from the second end of the resistor; and
send a third signal based on the termination voltage to the second terminal of the sense amplifier.

9. A method, comprising:
receiving a first signal on a first input of a receiver;
receiving a termination voltage on a second input of the receiver;
receiving the first signal on a first end of a resistor;
receiving the termination voltage on a second end of the resistor;
receiving the first signal on a first terminal of a sense amplifier;
receiving the termination voltage on a second terminal of the sense amplifier; and
generating a second signal based on a comparison of a voltage of the first signal to the termination voltage.

10. The method as recited in claim 9, wherein each of the resistor and the sense amplifier has an input dependent on a same power supply.

11. The method as recited in claim 9, tracking a common mode signal of the first signal.

12. The method as recited in claim 9, wherein the first signal is a single-ended data signal.

13. The method as recited in claim 9, wherein the termination voltage is one half of a supply voltage used within the apparatus.

14. The method as recited in claim 9, wherein the termination voltage is routed to inputs of a plurality of external circuits.

15. The method as recited in claim 9, wherein the method further comprises:
receiving, by electrostatic discharge protection circuitry, the first signal from the first input; and
sending, by the electrostatic discharge protection circuitry, the first signal to the first terminal of the sense amplifier.

16. The method as recited in claim 9, wherein the method further comprises:
receiving the termination voltage from the second end of the resistor; and
sending a third signal based on the termination voltage to the second terminal of the sense amplifier.

17. An apparatus comprising:
a plurality of receivers configured to receive signals;
a plurality of transmitters configured to send a plurality of signals to the plurality of receivers;
wherein a given receiver of the plurality of receivers is configured to receive a first signal of the plurality of signals from a given transmitter of the plurality of transmitters;
wherein each of the plurality of receivers is configured to receive a termination voltage from a termination voltage generator;
wherein the given receiver comprises:
a resistor configured to:
receive the first signal on a first end; and
receive the termination voltage on a second end; and
a sense amplifier configured to:
receive the first signal on a first terminal;
receive the termination voltage on a second terminal; and
generate a second signal based on a comparison of a voltage of the first signal to the termination voltage.

18. The apparatus as recited in claim 17, wherein each of the resistor and the sense amplifier has an input dependent on a same power supply.

19. The apparatus as recited in claim 17, wherein the apparatus is further configured to track a common mode signal of the first signal.

20. The apparatus as recited in claim 17, wherein the first signal is a single-ended data signal.

* * * * *